(12) United States Patent
Park et al.

(10) Patent No.: US 9,397,257 B2
(45) Date of Patent: Jul. 19, 2016

(54) LIGHT EMITTING DEVICE

(71) Applicant: LG INNOTEK CO., LTD., Seoul (KR)

(72) Inventors: Hae Jin Park, Seoul (KR); Kyoung Hoon Kim, Seoul (KR); Dong Ha Kim, Seoul (KR); Kwang chil Lee, Seoul (KR); Jae Hun Kim, Seoul (KR); Hwan Hui Yun, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/622,361

(22) Filed: Feb. 13, 2015

(65) Prior Publication Data

US 2015/0179878 A1 Jun. 25, 2015

Related U.S. Application Data

(63) Continuation of application No. 13/906,748, filed on May 31, 2013, now Pat. No. 9,000,415.

(30) Foreign Application Priority Data

Sep. 12, 2012 (KR) .......................... 10-2012-0101030
Dec. 3, 2012 (KR) .......................... 12-2012-0138944

(51) Int. Cl.
*H01L 33/32* (2010.01)
*H01L 33/54* (2010.01)
(Continued)

(52) U.S. Cl.
CPC ............ *H01L 33/06* (2013.01); *H01L 21/0237* (2013.01); *H01L 21/0242* (2013.01);
(Continued)

(58) Field of Classification Search
CPC ................................ H01L 33/06; H01L 33/14
USPC ............................................ 257/13, E21.573
See application file for complete search history.

(56) References Cited

U.S. PATENT DOCUMENTS

2005/0127391 A1 6/2005 Yanamoto
2007/0042571 A1* 2/2007 Shibata ................. C30B 29/403
438/478
(Continued)

FOREIGN PATENT DOCUMENTS

CN 101197410 A 6/2008
CN 101826582 A 9/2010

OTHER PUBLICATIONS

Wang T et al: "Air-Bridged Lateral Growth of an $Al_{0.98}Ga_{O.02}N$ Layer by Introduction of Porosity in an AlN Buffer"; American Institute of Physics, Applied Physics Letters, vol. 87, No. 15, Oct. 5, 2005, pp. 151906-1-151906-3 (XP 012075948).

(Continued)

*Primary Examiner* — Moazzam Hossain
(74) *Attorney, Agent, or Firm* — KED & Associaates, LLP

(57) ABSTRACT

The disclosed light emitting device includes an intermediate layer interposed between the light emitting semiconductor structure and the substrate. The light emitting semiconductor structure includes a first conductivity-type semiconductor layer, a second conductivity-type semiconductor layer, and an active layer interposed between the first conductivity-type semiconductor layer and the second conductivity-type semiconductor layer, wherein the active layer has a multi quantum well structure including at least one period of a pair structure of a quantum barrier layer including $Al_xGa_{(1-x)}N$ (0<x<1) and a quantum well layer including $Al_yGa_{(1-y)}N$ (0<x<y<1), and at least one of the first conductivity-type semiconductor layer and the second conductivity-type semiconductor layer includes AlGaN. The intermediate layer includes AlN and has a plurality of air voids formed in the AlN. At least some of the air voids are irregularly aligned and the number of the air voids is $10^7$ to $10^{10}$/cm².

16 Claims, 16 Drawing Sheets

(51) Int. Cl.
*H01L 33/06* (2010.01)
*H01L 33/12* (2010.01)
*H01L 21/02* (2006.01)
*H01L 33/02* (2010.01)
*H01L 33/62* (2010.01)
H01L 33/00 (2010.01)
H01L 33/20 (2010.01)

(52) U.S. Cl.
CPC ........ *H01L21/0254* (2013.01); *H01L 21/0262* (2013.01); *H01L 21/02458* (2013.01); *H01L 21/02513* (2013.01); *H01L 21/02576* (2013.01); *H01L 21/02579* (2013.01); *H01L 21/02647* (2013.01); *H01L 33/0025* (2013.01); *H01L 33/025* (2013.01); *H01L 33/12* (2013.01); *H01L 33/32* (2013.01); *H01L 33/54* (2013.01); *H01L 33/62* (2013.01); *H01L 33/007* (2013.01); *H01L 33/20* (2013.01); *H01L 2224/14* (2013.01); *H01L 2224/16245* (2013.01); *H01L 2933/0091* (2013.01)

(56) References Cited

U.S. PATENT DOCUMENTS

| | | | |
|---|---|---|---|
| 2007/0085095 A1* | 4/2007 | Ko | H01L 33/38 257/94 |
| 2007/0246700 A1 | 10/2007 | Park | |
| 2008/0048194 A1* | 2/2008 | Kudo | H01L 33/32 257/94 |
| 2008/0128716 A1 | 6/2008 | Tazima et al. | |
| 2009/0159871 A1 | 6/2009 | Lee et al. | |
| 2009/0230878 A1 | 9/2009 | Naito et al. | |
| 2010/0219439 A1* | 9/2010 | Kim | H01L 33/22 257/98 |
| 2010/0295015 A1* | 11/2010 | Kang | H01L 21/0237 257/13 |
| 2011/0127550 A1* | 6/2011 | Son | H01L 33/10 257/97 |
| 2011/0233574 A1 | 9/2011 | Lee et al. | |
| 2012/0138980 A1* | 6/2012 | Kuo | H01L 31/035227 257/94 |
| 2012/0199810 A1* | 8/2012 | Lee | H01L 21/02381 257/13 |

OTHER PUBLICATIONS

Bai J, et al.: "Mechanisms of Dislocation Reduction in an $Al_{0.98}Ga_{0.02}N$ layer grown using a porous AlN Buffer"; American Institute of Physics, Applied Physics Letters, vol. 89, No. 13, Sep. 29, 2006, pp. 131925-1 131925-3 (XP 012085993).

Matoli, Elison et al. "High Extraction Efficiency LED Based on Embedded Air Gap Photonic Crystals"; American Institute of Physics, Applied Physics Letter, No. 96; Published online Jan. 22, 2010; p. 031108-1.

United States Notice of Allowance dated Nov. 13, 2014 issued in U.S. Appl. No. 13/906,748.

European Search Report dated Dec. 9, 2014 issued in Application No. 13175026.7.

Chinese Office Action dated Oct. 10, 2015 issued in Application No. 201310334667.0.

* cited by examiner

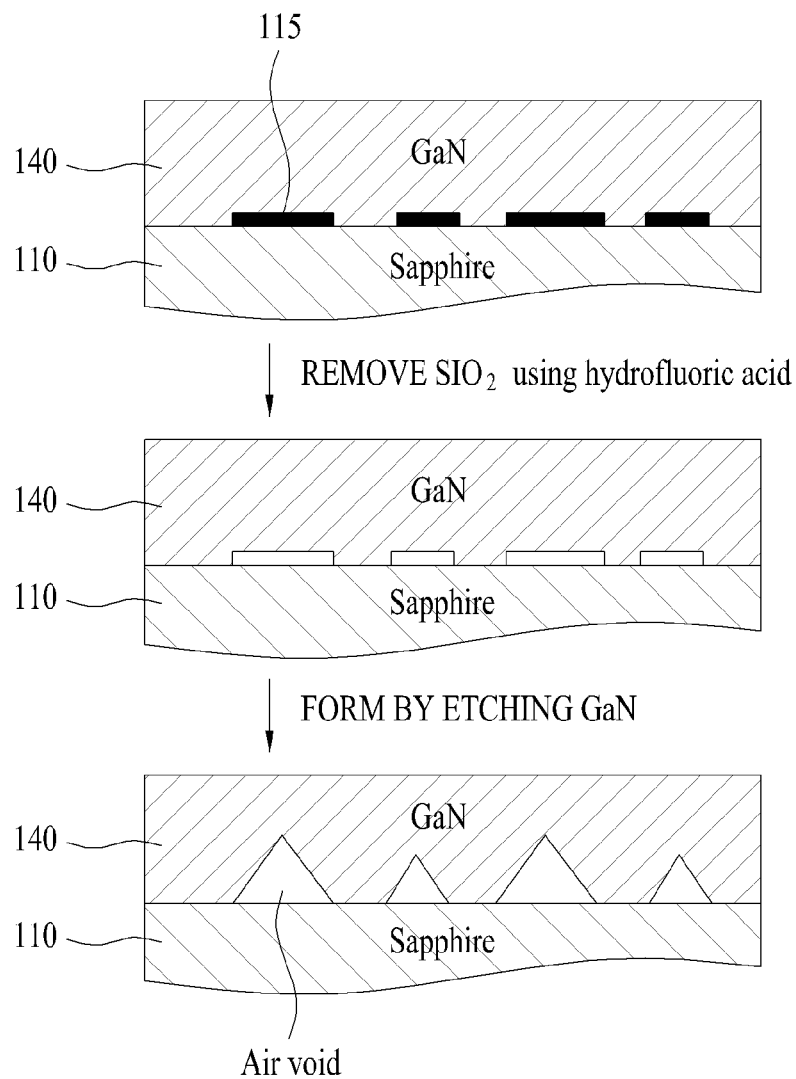

SiO$_2$ Mask

LIGHT EMITTING DEVICE

CROSS-REFERENCE TO RELATED APPLICATIONS

This application is a Continuation Application of prior U.S. patent application Ser. No. 13/906,748, which claims priority under 35 U.S.C. §119 to Korean Patent Application No 10-2012-0101030, filed in Korea on Sep. 12, 2012 and No. 10-2012-0138944, filed in Korea on Dec. 3, 2012, whose entire disclosures are hereby incorporated in its entirety by reference as if fully set forth herein.

BACKGROUND

1. Field

Embodiments relate to a light emitting device.

2. Background

Group III-V semiconductor materials such as GaN and AlGaN are widely applied to optoelectronics due to advantages of a wide and controllable energy bandgap. Particularly, light emitting devices such as light emitting diodes or laser diodes using a Group III-V or Group II-VI semiconductor material can now render a variety of colors such as red, green, blue, and ultraviolet through development of thin film growth technologies and device materials. It may also be possible to produce white light at high efficiency using fluorescent materials or through color mixing. Furthermore, such light emitting devices have advantages such as low power consumption, semi-permanent lifespan, fast response time, safety, and environmental friendliness as compared to conventional light sources, such as fluorescent lamps and incandescent lamps.

Therefore, these light emitting devices are increasingly applied to transmission modules of optimal communication units, light emitting diode backlights as a replacement for cold cathode fluorescent lamps (CCFLs) constituting backlights of liquid crystal display (LCD) devices, lighting apparatuses using white light emitting diodes as a replacement for fluorescent lamps or incandescent lamps, and headlights for vehicles and traffic lights.

FIG. 1 is a cross-sectional view illustrating a conventional light emitting device 100.

The conventional light emitting device 100 includes a substrate 110 formed of sapphire or the like, a light emitting structure 140 formed on the substrate 110 and including a first conductivity-type semiconductor layer 142, an active layer 144, and a second conductivity-type semiconductor layer 146, and a first electrode 152 and a second electrode 156 respectively disposed on the first conductivity-type semiconductor layer 142 and the second conductivity-type semiconductor layer 146.

The light emitting device 100 includes the active layer 144 in which electrons injected through the first conductivity-type semiconductor layer 142 meet holes injected through the second conductivity-type semiconductor layer 146 to emit light with energy determined by an intrinsic energy band of the material forming the active layer 144. Light emitted from the active layer 144 may vary according to the composition of the material constituting the active layer 144 and may be blue light, UV light, or deep UV light.

In the aforementioned light emitting device, particularly, in a horizontal light emitting device, light proceeding downward may be absorbed by the substrate 110 or undergo total reflection from an inner interface of the substrate 110, or the like, reducing light extraction efficiency.

In order to overcome this drawback, there is a need to reflect or scatter light at the surface of the substrate 110 to reduce total reflection of light.

FIG. 2A is a diagram illustrating air voids formed by a patterned substrate in a conventional light emitting device. FIG. 2B is a diagram illustrating a process of forming air voids in a conventional light emitting device by a wet etching process. FIG. 2C is a diagram illustrating functions of a mask of FIG. 2B.

In the light emitting device illustrated in FIG. 2A, air voids are formed at the surface of a buffer layer including AlN using a patterned sapphire substrate (PSS). In the light emitting device illustrated in FIG. 2A, a pattern and air voids are formed at the interface between the PSS and the buffer layer, so that light generated in a layer including GaN does not proceed into the PSS, but is instead scattered or reflected, thus improving light extraction efficiency of the light emitting device.

Referring to FIG. 2B, a mask 115 is formed on the surface of the substrate 110 including sapphire using a silicon oxide, and a light emitting structure 140 including GaN is grown thereon. Then, the silicon oxide ($SiO_2$) is removed using hydrofluoric acid or the like. GaN is etched at areas adjacent to regions from which the silicon oxide has been removed to form air voids.

FIG. 2C illustrates functions of a mask formed of silicon oxide or the like. Crystal defects, which are formed at the interface between a substrate and a buffer layer and illustrated by vertical solid lines herein, may be blocked by the mask shown as red lines. The buffer layer growing between the masks laterally grows as illustrated by lateral arrows, so that the buffer layer may also be formed adjacent to mask regions.

However, the aforementioned conventional light emitting device has the following problems.

A process for optimizing size, period, and shape of the pattern formed in the PSS needs to be added to the process of manufacturing the light emitting device illustrated in FIG. 2A. In addition, in the light emitting device illustrated in FIG. 2B, a manufacturing process may become overcomplicated and manufacturing costs may increase due to deposition and patterning of the silicon oxide and the wet etching process.

SUMMARY

Embodiments provide a light emitting device having improved luminous efficacy.

In one embodiment, a light emitting device includes a substrate, a UV light emitting semiconductor structure disposed on the substrate, and an intermediate layer interposed between the UV light emitting semiconductor structure and the substrate. The UV light emitting semiconductor structure includes a first conductivity-type semiconductor layer, a second conductivity-type semiconductor layer, and an active layer interposed between the first conductivity-type semiconductor layer and the second conductivity-type semiconductor layer. The active layer has a multi quantum well structure including at least one period of a pair structure of a quantum barrier layer including $Al_xGa_{(1-x)}N$ (0<x<1) and a quantum well layer including $Al_yGa_{(1-y)}N$ (0<x<y<1), and at least one of the first conductivity-type semiconductor layer and the second conductivity-type semiconductor layer includes AlGaN. The intermediate layer includes AlN and has a plurality of air voids formed in the AlN. At least some of the air voids are irregularly aligned and the number of the air voids is $10^7$ to $10^{10}/cm^2$.

In another embodiment, a light emitting device package includes a first lead frame and a second lead frame, a flip-chip light emitting device electrically connected to the first lead frame and the second lead frame via solders, and a mold surrounding the light emitting device. The light emitting device includes a substrate, a UV light emitting semiconductor structure disposed on the substrate, and an intermediate layer interposed between the UV light emitting semiconductor structure and the substrate. The UV light emitting semiconductor structure includes a first conductivity-type semiconductor layer, a second conductivity-type semiconductor layer, and an active layer interposed between the first conductivity-type semiconductor layer and the second conductivity-type semiconductor layer. The active layer has a multi quantum well structure including at least one period of a pair structure of a quantum barrier layer including $Al_xGa_{(1-x)}N$ (0<x<1) and a quantum well layer including $Al_yGa_{(1-y)}N$ (0<x<y<1), and at least one of the first conductivity-type semiconductor layer and the second conductivity-type semiconductor layer includes AlGaN. The intermediate layer includes AlN and has a plurality of air voids formed in the AlN. At least some of the air voids are irregularly aligned and the number of the air voids is $10^7$ to $10^{10}/cm^2$.

In another embodiment, a sterilizer includes a light emitting device mounted on one surface of a housing, a diffuse reflection member to diffusively reflect light emitted from the light emitting device, and a power supply to supply power to the light emitting device. The light emitting device includes a substrate, a UV light emitting semiconductor structure disposed on the substrate, and an intermediate layer interposed between the UV light emitting semiconductor structure and the substrate. The UV light emitting semiconductor structure includes a first conductivity-type semiconductor layer, a second conductivity-type semiconductor layer, and an active layer interposed between the first conductivity-type semiconductor layer and the second conductivity-type semiconductor layer. The active layer has a multi quantum well structure including at least one period of a pair structure of a quantum barrier layer including $Al_xGa_{(1-x)}N$ (0<x<1) and a quantum well layer including $Al_yGa_{(1-y)}N$ (0<x<y<1), and at least one of the first conductivity-type semiconductor layer and the second conductivity-type semiconductor layer includes AlGaN. The intermediate layer includes AlN and has a plurality of air voids formed in the AlN. At least some of the air voids are irregularly aligned and the number of the air voids is $10^7$ to $10^{10}/cm^2$.

The first conductivity-type semiconductor layer may include $Al_xIn_yGa_{(1-x-y)}N$ (0≤x≤1, and 0≤y≤1, and 0≤x+y≤1), and the second conductivity-type semiconductor layer includes $In_xAl_yGa_{1-x-y}N$ (0≤x≤1, 0≤y≤1, and 0≤x+y≤1).

The quantum well layer may include a second conductivity-type dopant.

A peak wavelength of UV light radiated from the UV light emitting semiconductor structure may be in the range of 315 nm to 350 nm.

The intermediate layer may have a thickness of 1.5 μm to 20 μm.

Each of the air voids may have a height smaller than a thickness of the intermediate layer by at least 1 μm.

Each of the air voids may have a height of 0.5 μm to 19 μm.

Each of the air voids may have one end disposed in contact with the interface between the substrate and the intermediate layer or to be spaced apart from the interface and the other end disposed in the intermediate layer.

A material forming the intermediate layer laterally may grow around each of the air voids to merge at an upper portion of the other end of the air void.

Dislocations of the intermediate layer laterally growing around each of the air voids may merge at an upper portion of the other end of the air void.

A distance between one end of each of the air voids and a region of the air void having a maximum width may be greater than a distance between the region having the maximum width to the other end of the air void.

A region of each of the air voids having a maximum width may be spaced apart from the interface between the substrate and the intermediate layer and the interface between the intermediate layer and the light emitting structure.

A difference in thermal expansion rate between the substrate and the intermediate layer may be greater than a difference in thermal expansion rate between the intermediate layer and the light emitting structure.

The number of the air voids may be in the range of $10^7$ to $10^8/cm^2$ or $10^9$ to $10^{10}/cm^2$.

BRIEF DESCRIPTION OF THE DRAWINGS

Arrangements and embodiments may be described in detail with reference to the following drawings in which like reference numerals refer to like elements and wherein:

FIG. 2B is a diagram illustrating a process of forming air voids in a conventional light emitting device by a wet etching process;

DESCRIPTION OF SPECIFIC EMBODIMENTS

Hereinafter, embodiments will be described with reference to the annexed drawings.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

Figure 3:
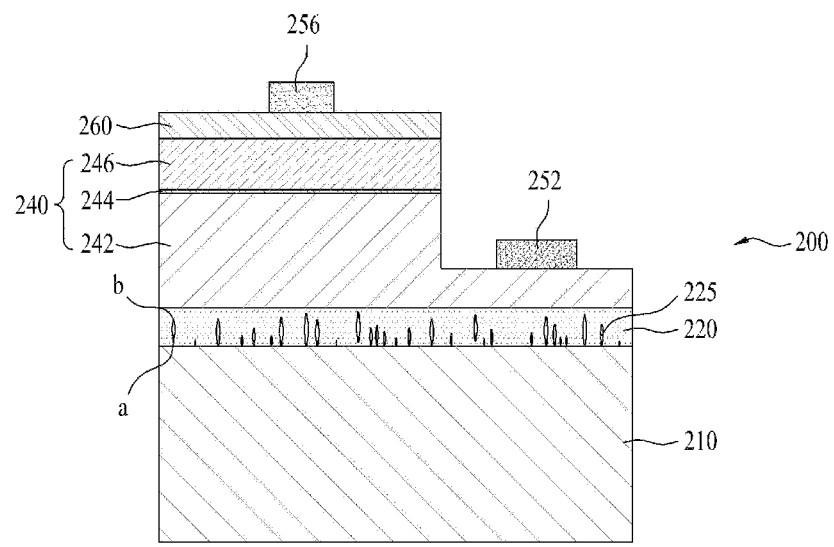
FIG. 3 is a cross-sectional view illustrating a light emitting device according to an embodiment of the present disclosure.

FIG. 3 is a cross-sectional view illustrating a light emitting device 200 according to an embodiment of the present disclosure.

The light emitting device 200 includes an intermediate layer 220 and a light emitting structure 240 which are disposed on a substrate 210.

The substrate 210 may be formed of a material suitable for growth of a semiconductor material, a carrier wafer, or a material having high thermal conductivity, and may include a conductive substrate or an insulating substrate. For example, at least one of sapphire ($Al_2O_3$), $SiO_2$, SiC, Si, GaAs, GaN, ZnO, GaP, InP, Ge, and $Ga_2O_3$ may be used.

According to the illustrated embodiment, the intermediate layer 220 is used to reduce lattice mismatch and differences in coefficient of thermal expansion between a material used to form the substrate 210 and a material used to form the light emitting structure 240. In addition to the intermediate layer 220, another intermediate layer may further be interposed between the substrate 210 and the light emitting structure 240. The above also applies to other embodiments to be described later. A material used to form the intermediate layer 240 may be a Group III-V semiconductor material, e.g., at least one of AlAs, GaN, InN, InGaN, AlGaN, InAlGaN, and AlInN in addition to AlN. However, the intermediate layer 220 may be an intermediate layer with different functions from a conventional buffer layer since the intermediate layer 220 has a predetermined thickness and air voids therein, which will be described later.

When the substrate 210 is formed of sapphire or the like, and the light emitting structure 240 including GaN or AlGaN is disposed on the substrate 210, considerable lattice mismatch between sapphire or GaN or AlGaN and significant differences in coefficient of thermal expansion therebetween may cause dislocations, melt-back, cracking, pitting, and surface morphology defects which deteriorate crystallinity. Thus, AlN may be used in the intermediate layer 220.

A plurality of air voids 225 may be formed in the intermediate layer 220. One end a of each of the air voids 225 may be disposed in contact with the interface between the substrate 210 and the intermediate layer 220 or may be disposed in the intermediate layer 220 to be spaced apart from the interface. The other end b of the air void 225 may be disposed in the intermediate layer 220. Structure and alignment of the air voids 220 will be described later.

Although not shown herein, an undoped GaN layer or AlGaN layer may be disposed between the intermediate layer 220 and the light emitting structure 240 to prevent the aforementioned dislocations or the like from spreading to the light emitting structure 240. In addition, dislocations are blocked in the intermediate layer 220 allowing growth of an intermediate layer having high quality and high crystallinity.

The light emitting structure 240 includes a first conductivity-type semiconductor layer 242, an active layer 244, and a second conductivity-type semiconductor layer 246.

The first conductivity-type semiconductor layer 242 may be formed of a Group III-V or Group II-VI semiconductor material and may be doped with a first-conductivity-type dopant. The first conductivity-type semiconductor layer 242 may include at least one semiconductor material represented by $Al_xIn_yGa_{(1-x-y)}N$ (0≤x≤1, 0≤y≤1, and 0≤x+y≤1), selected from the group consisting of AlGaN, GaN, InAlGaN, AlGaAs, GaP, GaAs, GaAsP, and AlGaInP. For example, the first conductivity-type semiconductor layer 242 may include $Al_{0.55}Ga_{0.45}N$.

When the first conductivity-type semiconductor layer 242 is an n-type semiconductor layer, the first-conductivity-type dopant may include an n-type dopant such as Si, Ge, Sn, Se, and Te. The first conductivity-type semiconductor layer 242 may have a single layer or multilayer structure, but the present disclosure is not limited thereto.

When the light emitting device 200 illustrated in FIG. 3 is a UV light emitting device, a deep UV light emitting device, or a non-polarized light emitting device, the first conductivity-type semiconductor layer 242 may include at least one of InAlGaN and AlGaN. When the first conductivity-type semiconductor layer 242 is formed of AlGaN, the content of Al may be 50%. When dislocations in the substrate or the intermediate layer spread to the active layer, defects caused by such dislocations may not be buffered, particularly, in the deep UV light emitting devices, since In is not used in deep UV light emitting devices. Thus, air voids serve an important role. In addition, in a deep UV light emitting device, a large amount of deep UV light is absorbed by GaN. Thus, AlGaN may be used as a material to form the light emitting structure.

The active layer 244 is disposed between the first conductivity-type semiconductor layer 242 and the second conductivity-type semiconductor layer 246 and may have at least one of a single well structure, a multi well structure, a single quantum well structure, a multi quantum well (MQW) structure, a quantum dot structure, or a quantum-wire structure.

The active layer 244 may have at least one pair structure of a well layer and a barrier layer using Group III-V semiconductor materials selected from the group consisting of AlGaN/AlGaN, InGaN/GaN, InGaN/InGaN, AlGaN/GaN, InAlGaN/GaN, GaAs(InGaAs)/AlGaAs, and GaP(InGaP)/AlGaP, but the present disclosure is not limited thereto. The well layer may be formed of a material having a lower energy band gap than that of the barrier layer.

In particularly, the active layer 244 according to the illustrated embodiment may generate UV light or deep UV light. In this regard, the active layer 244 may have a multi quantum well structure. Particularly, a multi quantum well structure including at least one pair structure of a quantum barrier layer including $Al_xGa_{(1-x)}N$ (0<x<1) and a quantum well layer including $Al_yGa_{(1-y)}N$ (0<x<y<1) may be used. In this regard, the quantum well layer may include a second conductivity-type dopant, which will be described later. The amount of the second conductivity-type dopant added to the quantum well layer may be increased in quantum wells adjacent to the second conductivity-type dopant semiconductor layer 246.

The second conductivity-type semiconductor layer 246 may be formed of a semiconductor compound. The second conductivity-type semiconductor layer 246 may include a Group III-V or Group II-VI semiconductor material and may be doped with the second conductivity-type dopant. The second conductivity-type semiconductor layer 246 may be formed of at least one semiconductor material represented by $In_xAl_yGa_{1-x-y}N$ (0≤x≤1, 0≤x≤1, and 0≤x+y≤1) selected from the group consisting of AlGaN, GaN AlInN, AlGaAs, GaP, GaAs, GaAsP, and AlGaInP. For example, when the second conductivity-type semiconductor layer 246 is formed of $Al_xGa_{(1-x)}N$, the amount of Al may be reduced from 0.55 to 0.3, and the amount of Ga may be increased from 0.45 to 0.7 with increasing distance from the active layer 244.

When the second conductivity-type semiconductor layer 246 is a p-type semiconductor layer, the second conductivity-type dopant may be a p-type dopant such as Mg, Zn, Ca, Sr, and Ba. The second conductivity-type semiconductor layer 246 may have a single layer or multilayer structure, but the present disclosure is not limited thereto. When the light emitting device 200 is a UV light emitting device, a deep UV light emitting device, or a non-polarized light emitting device, the second conductivity-type semiconductor layer 246 may include at least one of InAlGaN and AlGaN.

Although not shown herein, an electron blocking layer may be interposed between the active layer 244 and the second conductivity-type semiconductor layer 246. For example, an electron blocking layer having a superlattice structure may be interposed therebetween. The superlattice structure may include AlGaN doped with the second conductivity-type dopant and may be formed by alternately disposing a plurality of GaN layers having different Al contents.

A transparent conductive layer 260 may be disposed on the light emitting structure 240 such that current is uniformly supplied from the second electrode 256 to the second conductivity-type semiconductor layer 246 over a wide area. In addition, although not shown herein, the GaN layer may be interposed between the second conductivity-type semiconductor layer 246 and the transparent conductive layer 260. Alternatively, the GaN layer may be substitute for the transparent conductive layer 260 and may be doped with the second conductivity-type dopant.

When the substrate 210 is an insulating substrate, mesa etching is applied from the transparent conductive layer 260 to a portion of the first conductivity-type semiconductor layer 242 in order to supply current to the first conductivity-type semiconductor layer 242, thereby partially exposing the first conductivity-type semiconductor layer 242.

A first electrode 252 may be disposed on the exposed first conductivity-type semiconductor layer 242, and a second electrode 256 may be disposed on the transparent conductive layer 260.

In the light emitting device 200 having the aforementioned structure, since air voids are formed in the intermediate layer 220, growth of dislocations caused by lattice mismatch and differences in coefficient of thermal expansion may be prevented at the interface between the substrate 210 and the intermediate layer 220. In addition, light emitted downward from the active layer 244 as illustrated in FIG. 3 is scattered or refracted by the air voids 225, preventing the light from entering the substrate 210. Thus, light is totally reflected in the substrate 210, preventing light extraction of the light emitting device 200 from decreasing.

FIGS. 4A to 4F are diagrams illustrating a process of manufacturing the light emitting device of FIG. 3 according to an embodiment of the present disclosure.

Figure 4A:
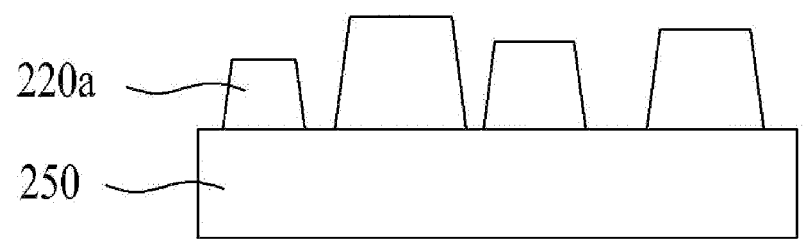
FIGS. 4A to 4F are diagrams illustrating a process of manufacturing the light emitting device of FIG. 3 according to an embodiment of the present disclosure.

First, as illustrated in FIG. 4A, seeds 220a for growing an intermediate layer 220 are formed on the substrate 210. The seeds 220a may have random sizes and may be randomly aligned.

Figure 4B:
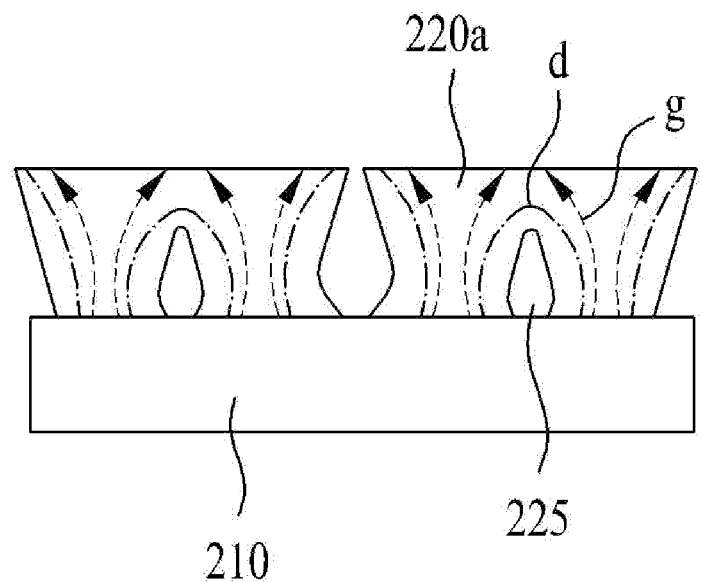

As illustrated in FIG. 4B, the intermediate layer 220 including air voids is grown on the substrate 210. In this regard, the composition of each layer illustrated in FIG. 4B is identical to that described with reference to FIG. 3. The composition of each layer of FIGS. 4C to 4F is also identical to that of FIG. 3, and thus a description thereof will not be given herein.

When the intermediate layer 220 is grown using AlN, tri-methyl aluminum (TMAl) and $NH_3$ may be supplied respectively at 10 to 100 (μmol/min) and at 50 to 500 (μmol/min) at 1200 to 1400° C. A molar ratio of the Group V element to the Group III element may be 100 or less. The intermediate layer 220 may grow at a rate of 2 to 6 μm/hr. As growth rate increases, the number of air voids formed increases. On the other hand, as growth rate decreases, process efficiency may be reduced.

When the temperature for growth of AlN is less than 1200° C., aluminum (Al) adsorbed at the sapphire surface slowly moves, so that seeds such as nuclei having excellent crystallinity may not be formed. On the other hand, when the temperature for growth of AlN is higher than 1400° C., the surface of sapphire is etched by hydrogen, deteriorating crystallinity of AlN. The intermediate layer 220 may further grow at a temperature of 1000 to 1600° C. In general, since Al has low surface mobility, high quality epitaxial growth needs to be performed at a high temperature. Thus, the intermediate layer 220 may grow at a temperature greater than 1000° C., and there is no need to increase the temperature over 1600° C.

In this regard, a plurality of air voids 225 may be formed from the interface between the substrate 210 and the intermediate layer 220. Dislocation may occur at the interface between the substrate 210 and the intermediate layer 220, or the like. However, dislocations may merge at regions contacting the air voids 225.

Crystal growth directions of AlN constituting the intermediate layer 220 are marked by dashed lines g. Since AlN grows horizontally as well as vertically, AlN growing horizontally or laterally around the air voids 225 merges. In addition, dislocations growing at the interface between the substrate 210 and the intermediate layer 220, or the like are marked by dash-dotted lines d. As AlN merges according to lateral growth, the dislocations merge.

Figure 4C:
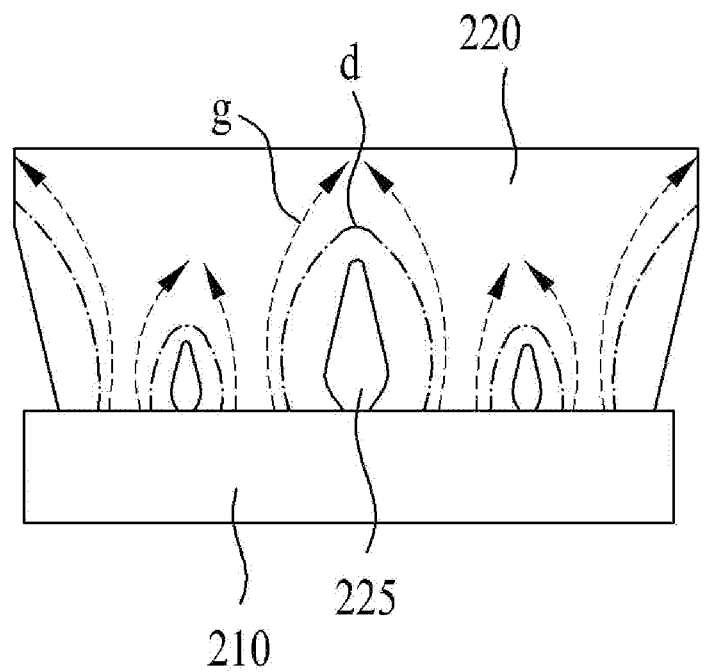

FIG. 4C illustrates the intermediate layer 220, growth of which is completed. Since AlN grows horizontally or laterally as well as vertically, growth of the air voids 225 is blocked, so that dislocations merge.

Air voids refer to regions of the intermediate layer 220 filled with air where AlN does not grow. Such air voids may be filled with process gas instead of air or may remain in a vacuum state.

Figure 9A:
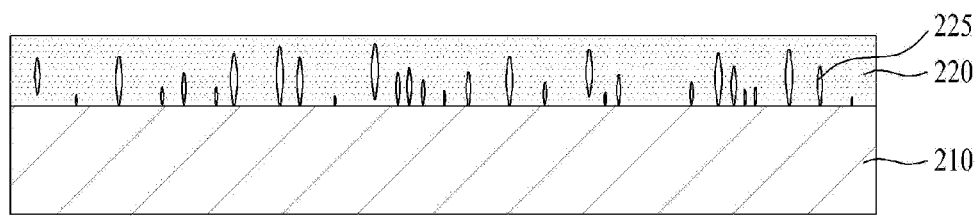
FIGS. 9A to 9C are diagrams illustrating deformation of air voids due to differences in coefficient of thermal expansion between a substrate and an intermediate layer.
Figure 9B:
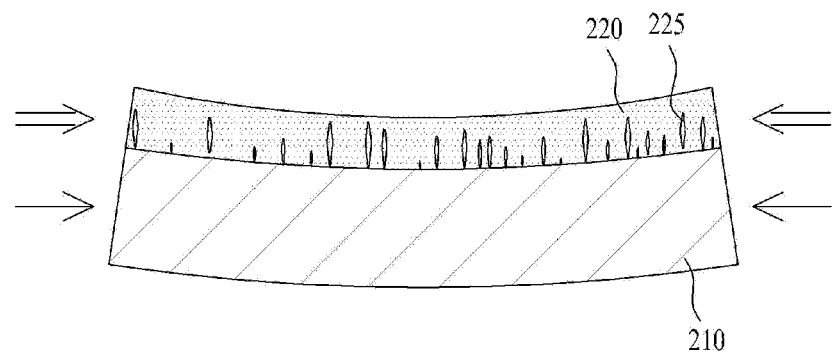
Figure 9C:
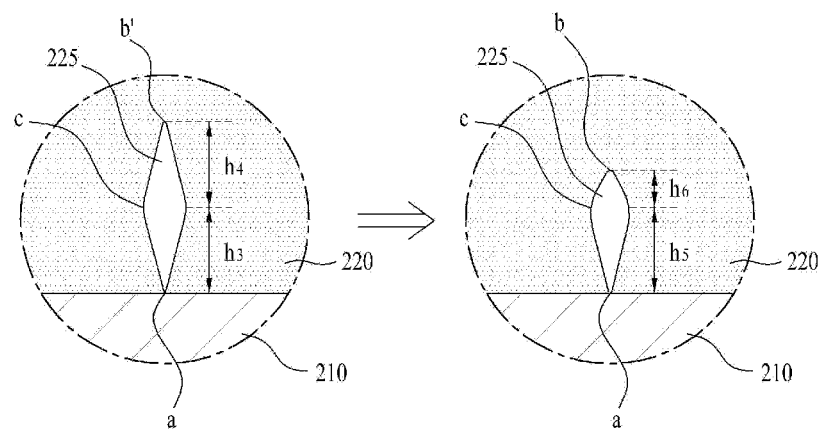

In FIG. 9C, a distance between one end of an air void and a region having a maximum width is greater than a distance between the region having the maximum width to the other end of the air void. However, the air voids 225 shown in FIG. 4C may differ from those of FIG. 9C since the air voids 225 are disposed in surface contact with the substrate 210.

Figure 4D:
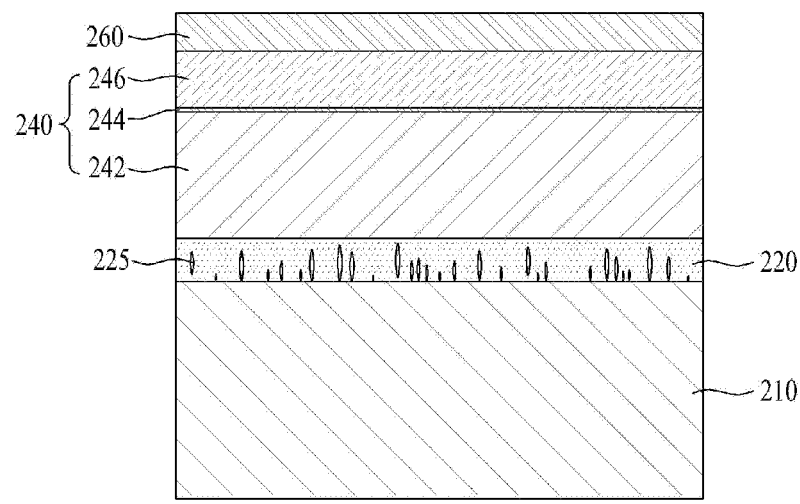

In addition, as illustrated in FIG. 4D, the light emitting structure 240 and the transparent conductive layer 260 are grown from the intermediate layer 220. The first conductivity-type semiconductor layer 242 may be formed using chemical vapor deposition (CVD), molecular beam epitaxy (MBE), sputtering, hydride vapor phase epitaxy (HVPE), or the like to form an AlGaN layer doped with an n-type dopant.

In addition, the first conductivity-type semiconductor layer 242 may be formed through injection of tri-methyl gallium (TMGa) gas, ammonia ($NH_3$) gas, nitrogen ($N_2$) gas, and silane ($SiH_4$) gas including n-type impurities such as silicon (Si).

The active layer 244 may have a multi quantum well structure through injection of tri-methyl gallium (TMGa) gas, ammonia ($NH_3$) gas, nitrogen ($N_2$) gas, and tri-methyl indium (TMIn) gas, but the present disclosure is not limited thereto.

The composition of the second conductivity-type semiconductor layer 246 has been described above. The second conductivity-type semiconductor layer 246 may be formed through injection of tri-methyl gallium (TMGa) gas, ammonia ($NH_3$), nitrogen ($N_2$) gas, and bicetyl cyclophentadienyl magnesium ($EtCp_2Mg$){$Mg(C_2H_5C_5H_4)_2$} including p-type impurities such as magnesium (Mg) into a chamber to form a p-type GaN layer, but the present disclosure is not limited thereto. In addition, the transparent conductive layer 260 is formed of a material such as indium tin oxide (ITO).

Figure 4E:
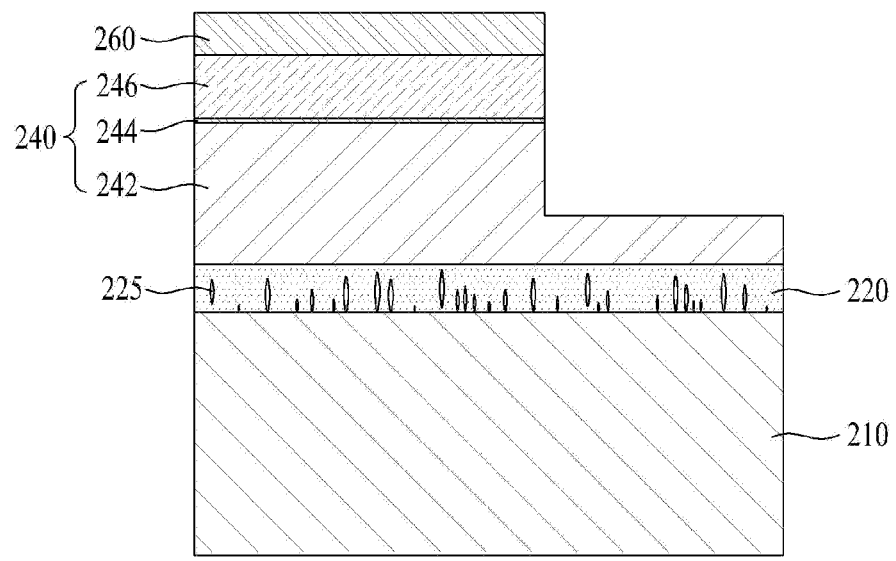

Then, as illustrated in FIG. 4E, mesa etching is applied to the transparent conductive layer 260 at a side through the second conductivity-type semiconductor layer 246 and the active layer 244 to a portion of the first conductivity-type semiconductor layer 242, thereby partially exposing the first conductivity-type semiconductor layer 242.

Figure 4F:
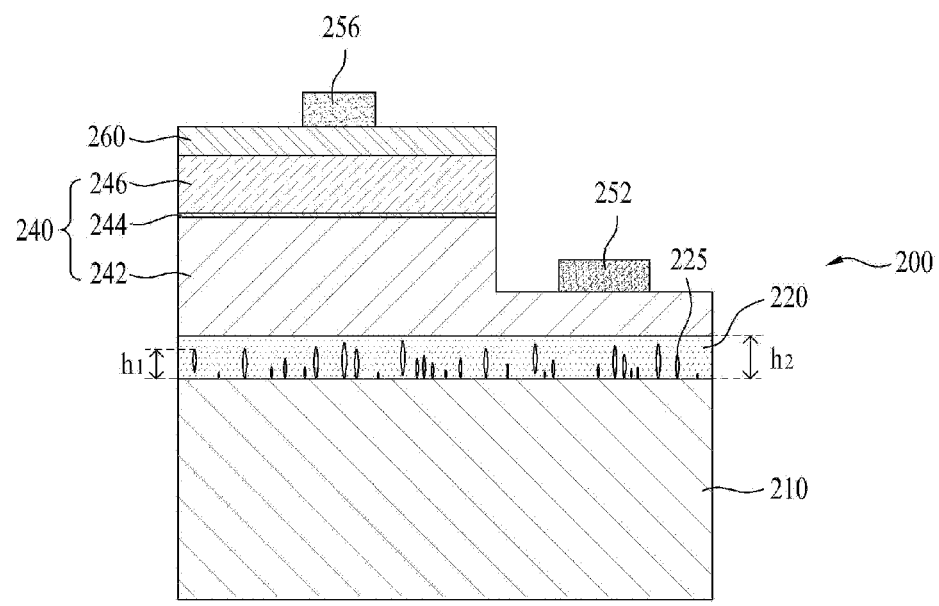

Then, as illustrated in FIG. 4F, the first electrode 252 and the second electrode 256 may be respectively disposed on the exposed first conductivity-type semiconductor layer 242 and the transparent conductive layer 260. The first electrode 252 and/or the second electrode 256 may be formed of a conductive material, such as a metal, particularly, a metal selected from the group consisting of Ag, Ni, Al, Rh, Pd, Ir, Ru, Mg, Zn, Pt, Au, Hf, and any combination thereof in a single layer or multilayer structure.

In FIG. 4F, a height $h_1$ of each of the air voids 225 may be less than an overall thickness $h_2$ of the intermediate layer 220 by at least 1 μm. The thickness $h_2$ of the intermediate layer 220 may be in the range of 1.5 μm to 20 μm, and the thickness $h_1$ of each air void 225 may be in the range of 0.5 μm to 19 μm.

In addition, the air voids 225 may have a density of $10^7$ to $10^{10}$ air voids/cm$^2$.

The height $h_1$ and a width of each of the air voids 225 may randomly vary since the air voids 225 naturally grow under controlled conditions while growing the intermediate layer 220 on the substrate 210 according to the aforementioned process. The air voids 225 may also have random shapes and alignments in at least one region. Distance and pitch between adjacent air voids 225 may not be uniform as illustrated in FIG. 4F.

Figure 5A:
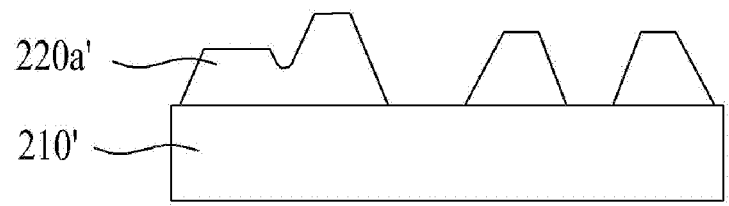
FIGS. 5A and 5B are diagrams illustrating a process of manufacturing the light emitting device of FIG. 3 according to another embodiment of the present disclosure.
Figure 5B:
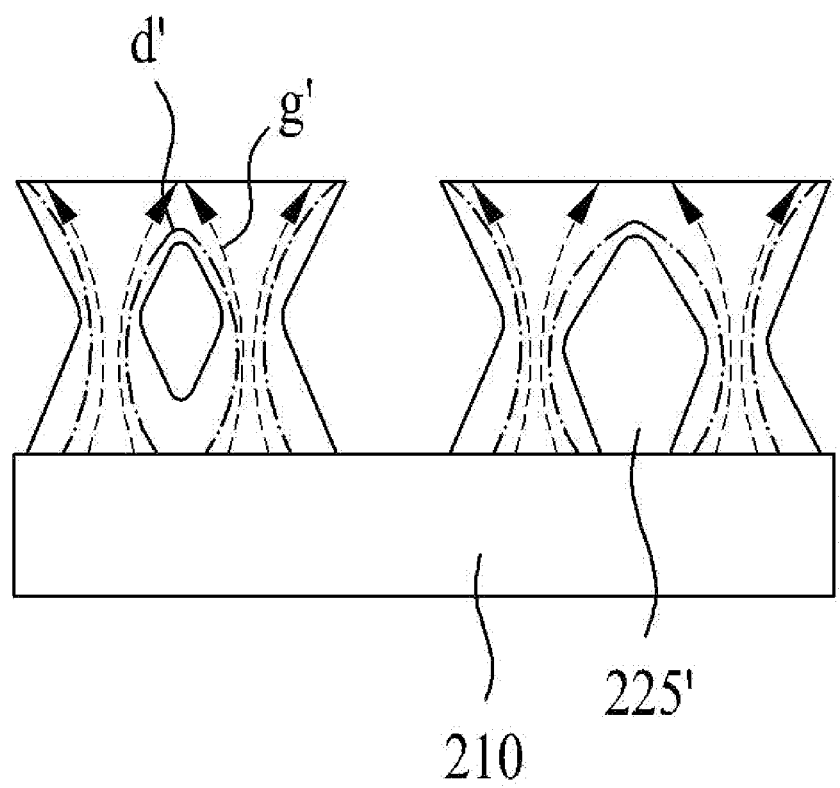

FIGS. 5A and 5B are diagrams illustrating a process of manufacturing the light emitting device of FIG. 3 according to another embodiment of the present disclosure. According to the embodiment described with reference to FIGS. 4A to 4F, the air voids 225 grow from the interface between the substrate 210 and the intermediate layer 220. According to the illustrated embodiment, however, air voids 225' grow within an intermediate layer 220'. That is, referring to FIG. 5A, seeds 220a formed of AlN or the like may overlap each other on a substrate 210'. Accordingly, air voids 225' may grow between adjacent seeds 220a' at a distance from the substrate 210'. The seeds 220a' vertically and horizontally grow as marked by dashed lines g' to complete growth of the air voids 225', and dislocations marked by dash-dotted lines d' may merge as illustrated in FIG. 5B. Subsequent processes of the method of manufacturing the light emitting device according to the illustrated embodiment are the same as those of the aforementioned method.

Figure 1:
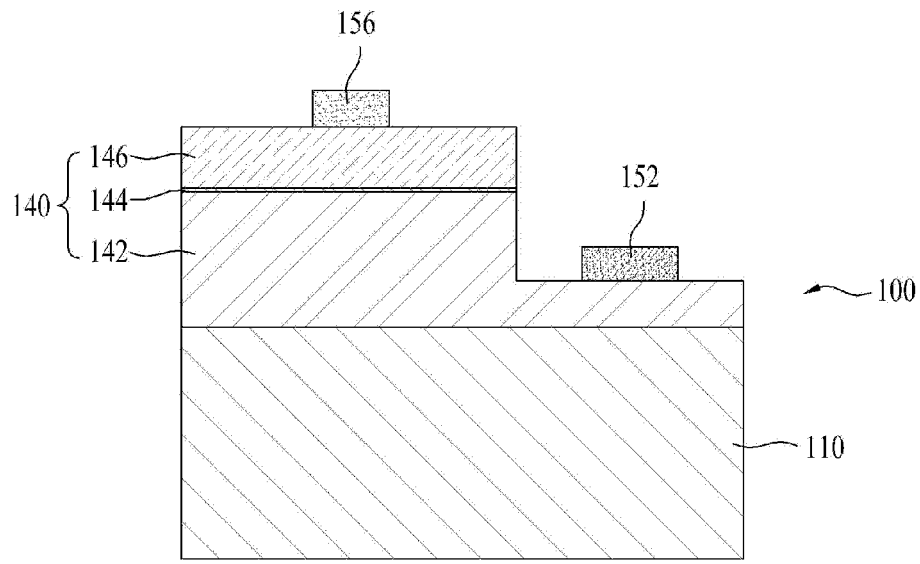
FIG. 1 is a cross-sectional view illustrating a conventional light emitting device 100.
Figure 2A:
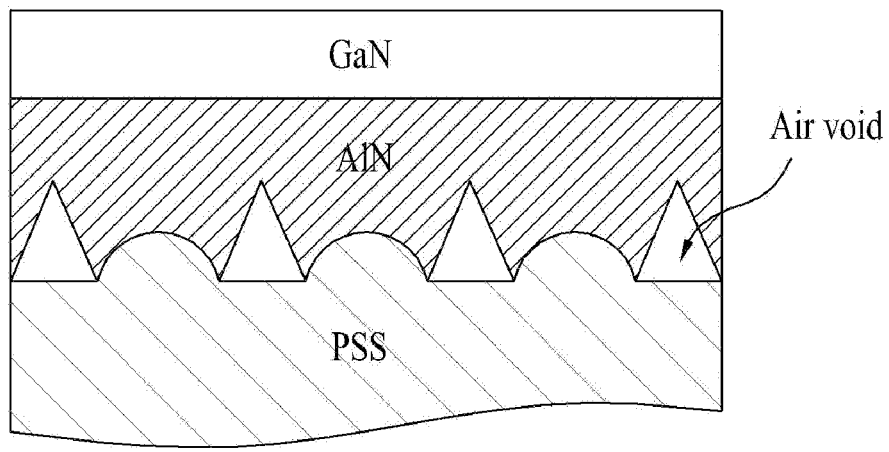
FIG. 2A is a diagram illustrating air voids formed by a patterned substrate in a conventional light emitting device.
Figure 2C:
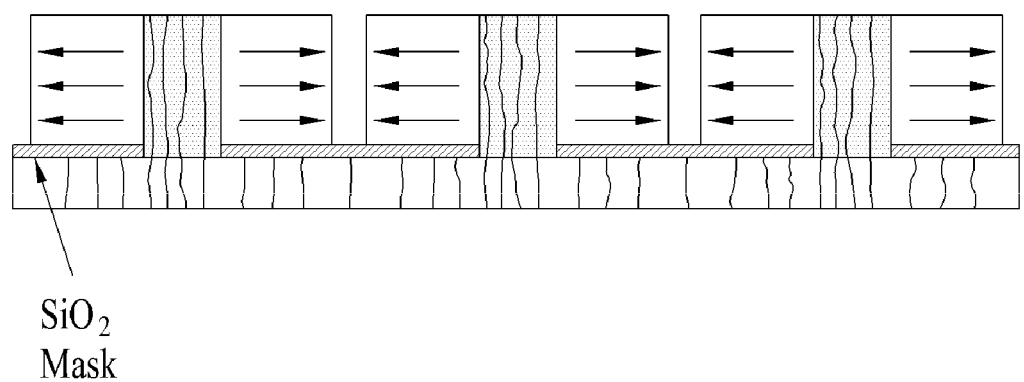
FIG. 2C is a diagram illustrating functions of a mask of FIG. 2B.

The aforementioned air voids are different from those illustrated in FIGS. 2A to 2C formed using a mask which will be described later in that the aforementioned air voids have random shapes and sizes and are randomly aligned, but air voids according to FIGS. 2A to 2C have a uniform shape and a periodic alignment. In addition, when a mask is used, the distance and/or pitch between air voids are not controllable to a predetermined size, for example, at nanometer scale. According to the illustrated embodiment, however, since the air voids naturally grow during growth of AlN, the distance and/or pitch between the air voids may be controlled at nanometer scale, and the density of the air voids may be greater than that of the air voids manufactured using a mask process.

For example, as described above, the air voids may have a density of $10^7$ to $10^{10}$/cm$^2$. Here, density of air voids refers to number air voids formed per unit area. The density of air voids provides greater resolution than photolithographic techniques developed to date. Since air voids are more densely aligned compared to conventionally formed air voids, light extraction efficiency of the light emitting device may be improved. When the number of the air voids is $10^7$ to $10^8$ or $10^9$ to $10^{10}$/cm$^2$, light extraction efficiency of the light emitting device may be further improved.

Air voids having a density of $10^7$/cm$^2$ or less may be formed using the aforementioned mask process. The air voids may have a size of 2 to 3 μm when the air voids are formed by photolithography and dry etching using a mask disposed on AlN. In this case, when the air voids having a length and a width respectively of 2 μm are formed, density thereof may be $6 \times 10^6$/cm$^2$. When the air voids having a length and a width respectively of 3 μm are formed, density thereof may be $3 \times 10^6$/cm$^2$. Thus, a conventional process of using a mask may be used to form air voids having a density of $10^7$/cm$^2$ or less.

When the number of air voids exceeds $10^6$/cm$^2$, AlN surrounding the air voids does not sufficiently horizontally grow, so that dislocation may not merge or horizontally growing AlN may not merge at an upper portion of each air void.

Figure 6:
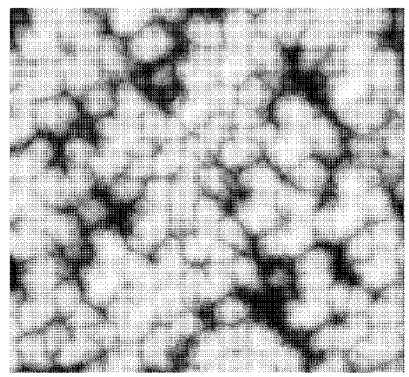
FIG. 6 is an AFM image of air voids.

FIG. 6 is an AFM image of air voids

Figure 7A:
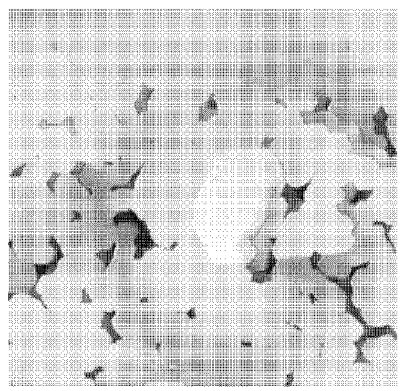
FIGS. 7A and 7B are AFM images of an intermediate layer where air voids are formed after growing AlN to 1 μm.
Figure 7B:
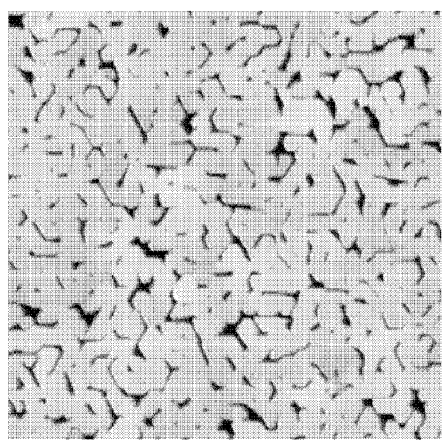

In the left image, dark regions indicate the air voids, and bright regions indicate AlN. When AlN grows to a width or diameter of 0.05 μm or greater, air voids may be formed. The right image is an enlarged image of the left image. In the right image, 4 air voids are formed in a region having a height of 0.1 μm and a width of 0.15 μm (indicated by a red line). Thus, the air voids may have a density of $3 \times 10^{10}$/cm$^2$. Therefore, it is difficult to form the air voids to a density of $10^{11}$/cm$^2$ or greater. FIGS. 7A and 7B are AFM images of an intermediate layer in which air voids are formed after growing AlN to 1 μm.

FIG. 7A illustrates air voids having a density of $10^8$/cm$^2$ or greater. FIG. 7B illustrates air voids having a density of $10^9$/cm$^2$ or greater. A relative light intensity of the light emitting devices shown in FIGS. 7A and 7B is 1 to 1.3. Light scattering effects may be improved due to increased density of the air voids in FIG. 7B.

When the air voids have a density of $10^7$/cm$^2$ or less, light intensity of the light emitting device may be reduced by 50% compared with that illustrated in FIG. 7A. When the air voids have a density of $10^{11}$/cm$^2$ or greater, adjacent air voids may merge and AlN defects may occur at the merged regions. Thus, internal quantum efficiency may be reduced in a multi quantum well structure of the active layer, so that light intensity of the light emitting device may be reduced by 50% compared with that illustrated in FIG. 7A.

Figure 8A:
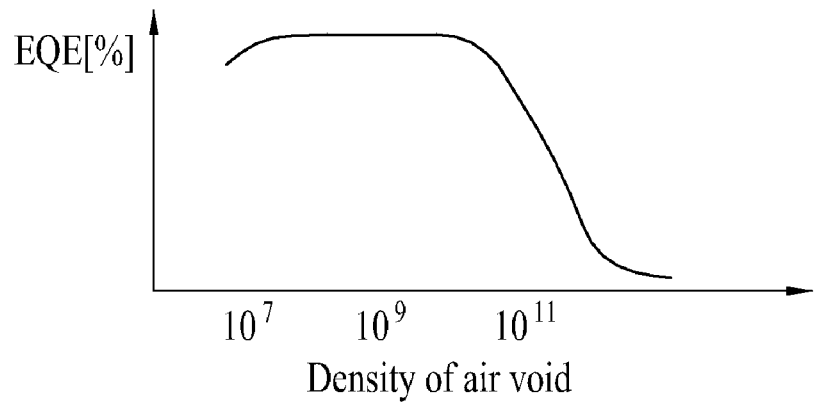
FIGS. 8A to 8C are graphs illustrating internal quantum efficiency, light scattering effect, and light extraction efficiency of a light emitting device with respect to density of air voids.
Figure 8B:
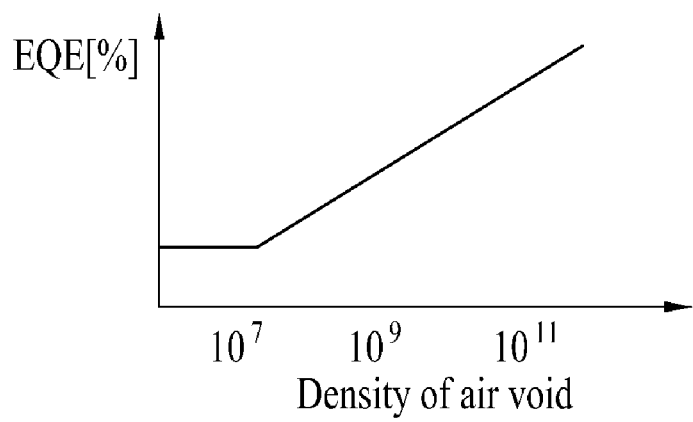
Figure 8C:
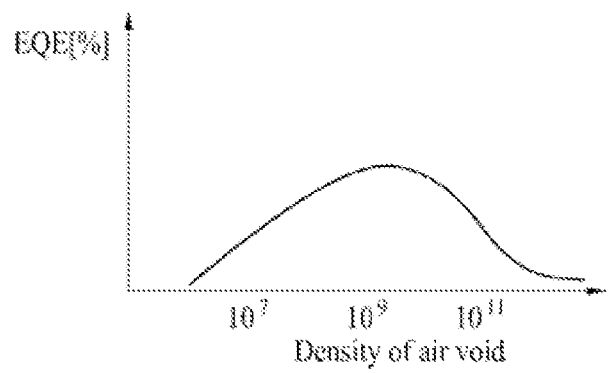

FIGS. 8A to 8C are graphs illustrating internal quantum efficiency, light scattering effect, and light extraction efficiency of a light emitting device with respect to air void density.

Referring to FIG. 8A, when the air voids have a density of $10^{11}$/cm$^2$ or greater, internal quantum efficiency (IQE) is reduced in the multi quantum well structure of the light emitting device. Referring to FIG. 8B, as the density of the air voids increases, light extraction efficiency (LEE) is improved. Referring to FIGS. 8A to 8C, optimal light extraction efficiency of the light emitting device may be obtained when the air voids have a density of $10^7$ to $10^{11}$/cm$^2$.

When the size or density of the air voids increases by varying growth conditions, dislocations may be efficiently prevented, but laterally growing AlN may not be sufficiently formed over the air voids. On the other hand, when the size or density of the air voids decreases, laterally growing AlN may be efficiently formed over the air voids, but dislocations are not sufficiently prevented, and the active layer may not be sufficiently refracted or scattered.

FIGS. 9A to 9C are diagrams illustrating deformation of air voids due to differences in coefficient of thermal expansion between a substrate and an intermediate layer.

In the manufacturing process of the light emitting device, growth of the intermediate layer or the light emitting structure requires high temperature processing. Thus, while the light emitting device is cooled to room temperature after the growth process, the structure thereof may shrink according to the coefficient of thermal expansion so as to decrease in length or volume thereof.

Such thermal expansion or shrinkage may vary according to the coefficient of thermal expansion of each layer, and thus each layer or interface may bow. Difference in coefficient of thermal expansion between the substrate 210 formed of sapphire or the like and the intermediate layer 220 formed of AlN or the like may be greater than difference in coefficient of thermal expansion between the light emitting structure 240 formed of GaN or AlGaN and the intermediate layer 220.

The coefficient of thermal expansion of the intermediate layer 220 is greater than that of the substrate 210. Thus, when the temperature is reduced to room temperature after the high temperature growth process illustrated in FIG. 9A, the substrate 210 and the intermediate layer 220 partially bend as illustrated in FIG. 9B. In this regard, the intermediate layer 220 bends more than the substrate 210.

In this regard, the intermediate layer 220 may shrink at a region farther from the substrate 210, i.e., a region in contact with the light emitting structure, more than at a region in contact with the substrate 210. In addition, as the intermediate layer 220 shrinks, the size of the air voids may decrease. Since the region of the intermediate layer 220 farther from the substrate 210 shrinks more, a transverse cross-section of each air void at the region farther from the substrate 210 may be less than that of the air void at the opposite region thereof as illustrated in FIG. 9C.

In order to describe the structure of the air voids in more detail, the transverse size of the air void is exaggerated in FIG. 9C. The air voids may have random sizes and may be randomly aligned as described above or may form a quadrangle with a longer vertical cross-section as illustrated herein or other shapes.

That is, when a region of the air void contacting the substrate 210 is referred to as "one end a", a region of the air void opposite to the substrate 210 is referred to as "the other end b", and a central region of the air void is referred to as "central region c", a height $h_3$ between the one end a and the central region c may be identical or similar to a height $h_4$ between the central region c and the other end b before thermal shrinkage. As illustrated herein, the central region c is a region between the one end a and the other end b and may be closer to the other end b than the one end a.

After thermal shrinkage, a cross-section of a region of the air void farther from the substrate 210 may be reduced more than the opposite region. Here, a height $h_5$ between the one end a and the central region c may be greater than a height $h_6$ between the central region c and the other end b. Furthermore, the intermediate layer 220 may entirely shrink by heat, and the size of the air void may be reduced, so that $h_3 > h_5$.

Figure 10:
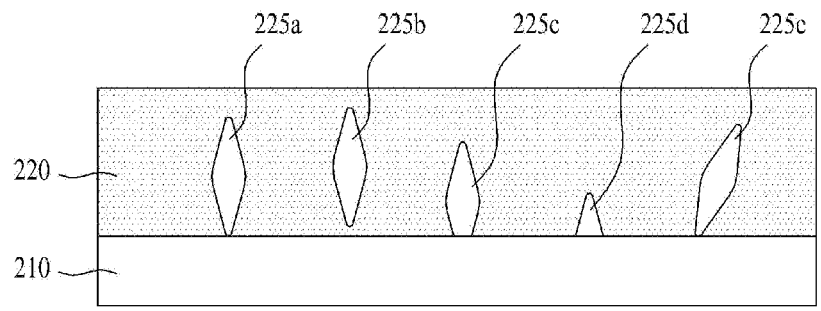
FIG. 10 is a diagram illustrating shapes of air voids according to an embodiment of the present disclosure.

FIG. 10 is a diagram illustrating shapes of air voids according to an embodiment of the present disclosure.

An air void 225a has one end disposed at the interface between the substrate 210 and the intermediate layer 220, an air void 225b has one end disposed at a distance from the interface between the substrate 210 and the intermediate layer 220. Air voids 225c and 225d are disposed such that regions thereof each having a predetermined width contact the interface between the substrate 210 and the intermediate layer 220, and an air void 225e has a similar shape to the air void 225a and leans to one side.

The air voids may have various shapes as described above. In the aforementioned drawings, a shape similar to a rhombus or a shape having a predetermined width is illustrated to describe the growth process, but the present disclosure is not limited thereto. The air void may have any geometric shape in which a width of the air void increases from the interface between the substrate 210 and the intermediate layer 220 and decreases from a predetermined height. The air voids may be expressed as black lines or strings in SEM images, which will be described later.

FIGS. 11A to 11E are diagrams illustrating a process of manufacturing a light emitting device according to another embodiment of the present disclosure.

According to the illustrated embodiment, a process of manufacturing a vertical light emitting device is described.

Figure 11A:
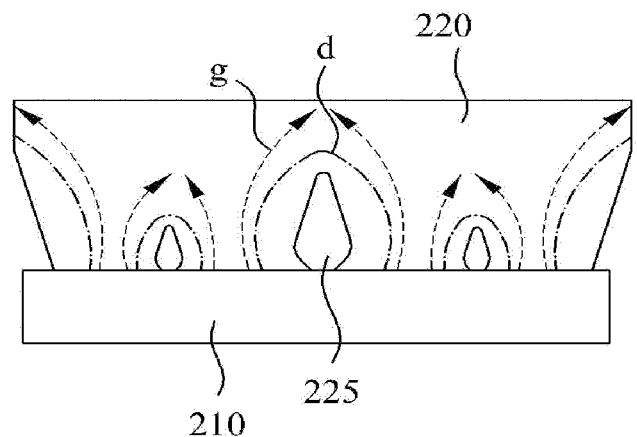
FIGS. 11A to 11E are diagrams illustrating a process of manufacturing a light emitting device according to another embodiment of the present disclosure.

Referring to FIG. 11A, AlN seeds are formed on the substrate 210 to grow the intermediate layer 220. In the intermediate layer 220, air voids 225 may be formed in the same manner as described with reference to FIGS. 4A to 4C and 5A to 5C.

Figure 11B:
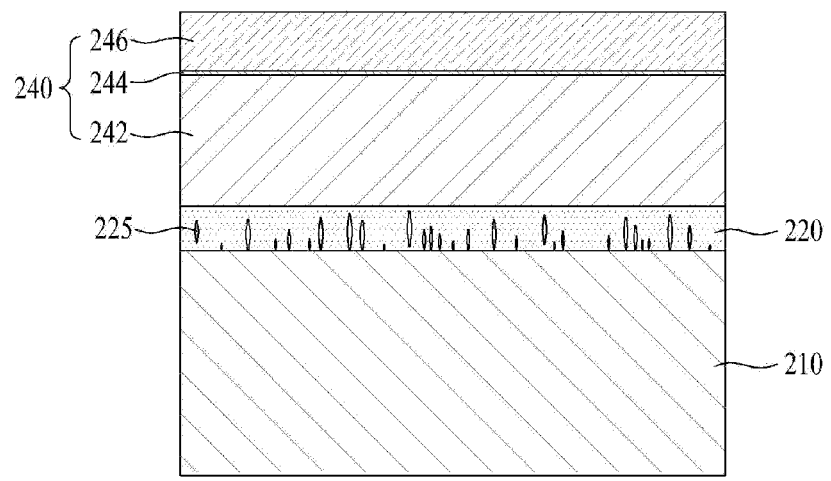

Then, as illustrated in FIG. 11B, a light emitting structure 240 is grown on the intermediate layer 220. In this regard, a transparent conductive layer may not be formed on the light emitting structure 240.

Figure 11C:
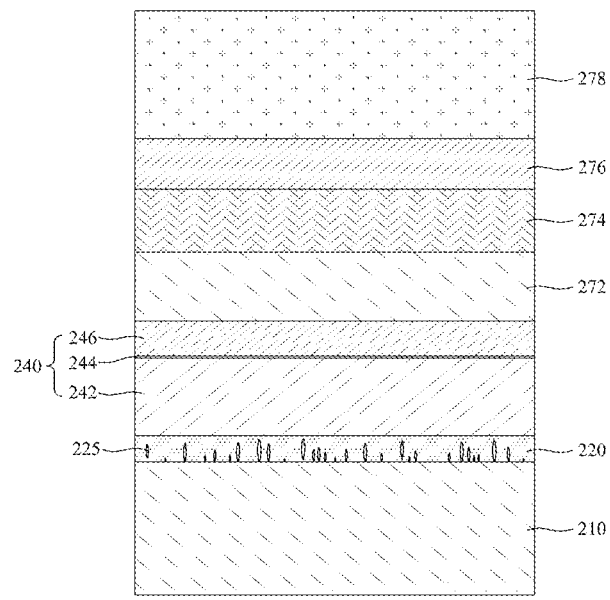

Then, as illustrated in FIG. 11C, an ohmic layer 272, a reflective layer 274, a bonding layer 276, and a conductive support substrate 278 may be formed on the light emitting structure 240. The ohmic layer 272, the reflective layer 274, the bonding layer 276, and the conductive support substrate 278 may function as a second electrode.

The ohmic layer 272 may have a thickness of about 200 Å. The ohmic layer 272 may be formed of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, or Ni/IrOx/Au/ITO, and a material including at least one selected from the group consisting of Ag, Ni, Cr, Ti, Al, Rh, Pd, Ir, Sn, In, Ru, Mg, Zn, Pt, Au, and Hf, although the present disclosure is not limited thereto.

The reflective layer 274 may be a metal layer formed of aluminum (Al), silver (Ag), nickel (Ni), platinum (Pt), rhodium (Rh), or an alloy including Al, Ag, Pt, or Rh. Al or Ag efficiently reflects light emitted from the active layer 244 to considerably improve light extraction efficiency of the light emitting device.

The conductive support substrate (metal support) 278 may be formed of a metal having excellent electrical conductivity and excellent thermal conductivity to sufficiently dissipate heat generated during operation of the light emitting device.

The conductive support substrate 278 may be formed of a metal or a semiconductor. The conductive support substrate 278 may also be formed of a material with excellent electrical and thermal conductivity. For example, the conductive support substrate 278 may be formed of a material selected from the group consisting of molybdenum (Mo), silicon (Si), tungsten (W), copper (Cu), and aluminum (Al), or an alloy thereof, and may selectively include gold (Au), a Cu Alloy, nickel (Ni), a Cu—W alloy, a carrier wafer (e.g.: GaN, Si, Ge, GaAs, ZnO, SiGe, SiC, SiGe, and $Ga_2O_3$).

The conductive support substrate 278 may have a mechanical strength sufficiently low for easy separation into chips by a scribing process and a breaking process without causing bending of the overall nitride semiconductor.

The bonding layer 276 bonds the reflective layer 274 and the conductive support substrate 278 and may be formed of a material selected from the group consisting of gold (Au), tin (Sn), indium (In), aluminum (Al), silicon (Si), silver (Ag), nickel (Ni), and copper (Cu), or alloys thereof.

The ohmic layer 272 and the reflective layer 274 may be formed via sputtering or e-beam deposition, and the conductive support substrate 278 may be formed by electrochemical metal deposition, metal eutectic bonding, and the like. Alternatively, the separate bonding layer 276 may be formed.

Figure 11D:
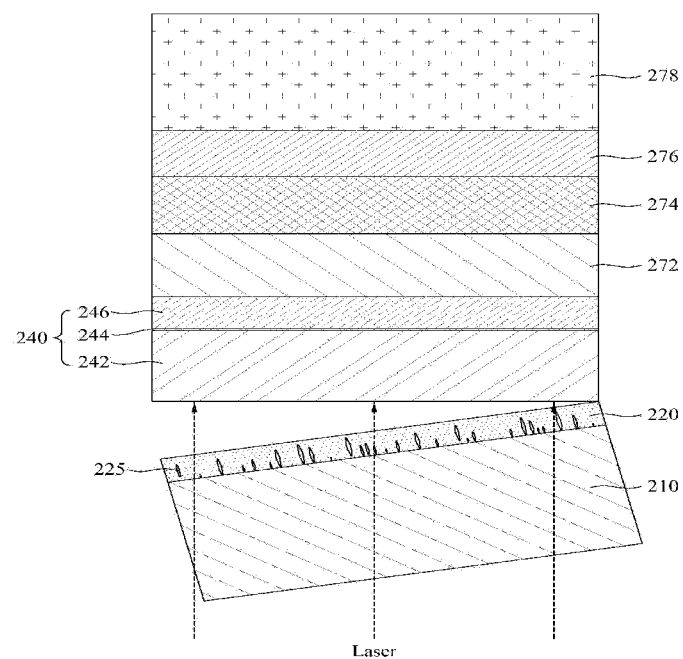

Then, as illustrated in FIG. 11D, the substrate 210 is separated. Removal of the substrate 210 may be conducted using a laser lift-off (LLO) process using an excimer laser, or dry/wet etching.

Hereinafter, separation of the substrate 210 through LLO will be described in brief. When an excimer laser of a predetermined wavelength range is radiated toward the substrate 210 in a focused state, thermal energy is concentrated at the interface between the substrate 210 and the light emitting structure 240, so that the interface is split into gallium and nitrogen molecules. As a result, instantaneous separation of the substrate 210 occurs in a region upon which the laser is incident. Simultaneously, the intermediate layer 220 may also be separated by dry etching.

If the substrate 210 is a silicon substrate, the substrate 210 may be separated by wet etching, and the intermediate layer 220 may also be separated by dry etching.

Subsequently, the light emitting structure 240 from which the substrate 210 is separated is subjected to dicing so as to divide the same into portions each corresponding to a unit light emitting device. Here, each portion of the light emitting structure 240 may be etched using a mask (not shown).

Figure 11E:
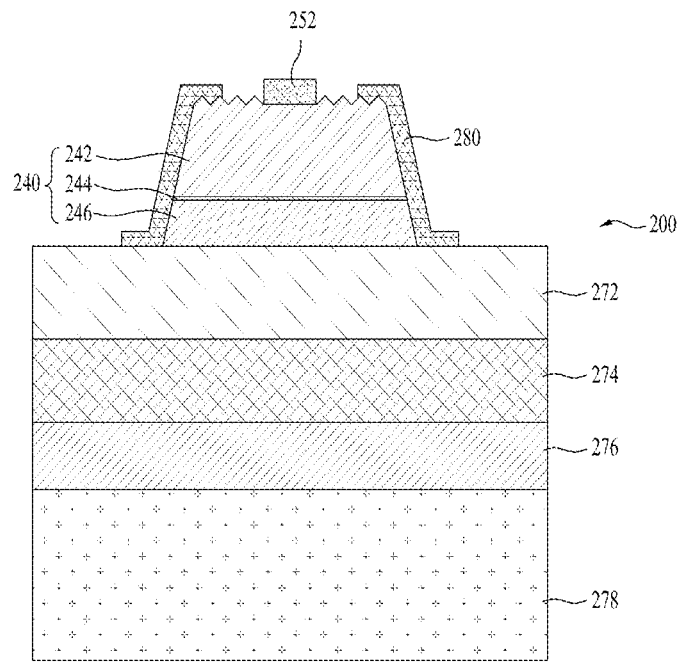

As illustrated in FIG. 11E, an uneven structure may be partially formed on the first conductivity-type semiconductor layer 242, and a first electrode 252 and a passivation layer 280 are formed. The first electrode 252 may have the composition as described above and may be disposed on a flat region of the surface of the first conductivity-type semiconductor layer 242. The passivation layer 280 may be formed of an insulating material composed of non-conductive oxides or nitrides. For example, the passivation layer 280 may be a silicon oxide ($SiO_2$) layer, an oxynitride layer, or an aluminum oxide layer.

In the light emitting device 200 illustrated in FIG. 11E, the air voids are removed simultaneously with removal of the intermediate layer. Dislocations generated at the interface between the substrate and the intermediate layer are blocked by the aforementioned air voids during growth of the light emitting structure 240, thus improving quality of the light emitting structure formed of AlGaN or GaN.

FIGS. 12A to 12D are SEM images and CL images of the light emitting device of FIG. 3.

Figure 12A:
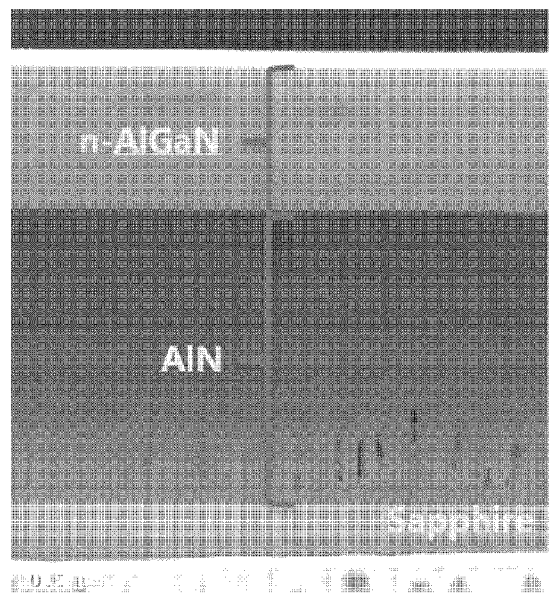
FIGS. 12A to 12D are SEM images and CL images of the light emitting device of FIG. 3.
Figure 12B:
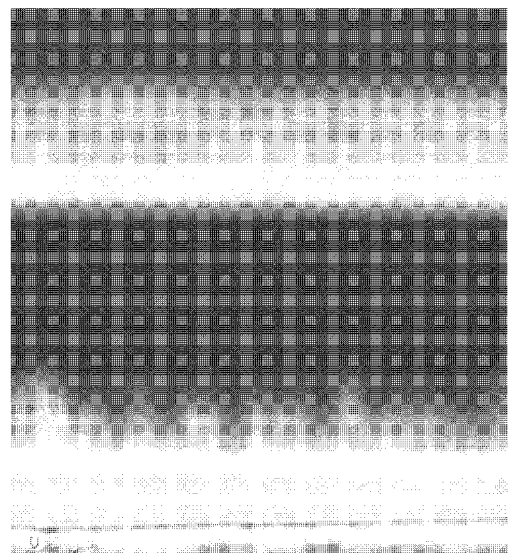
Figure 12C:
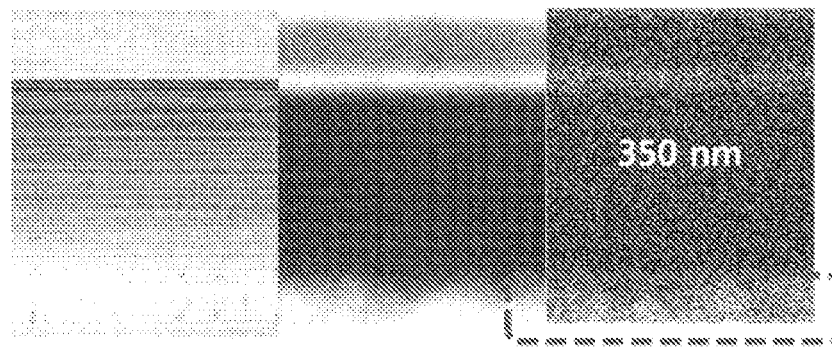
Figure 12D:
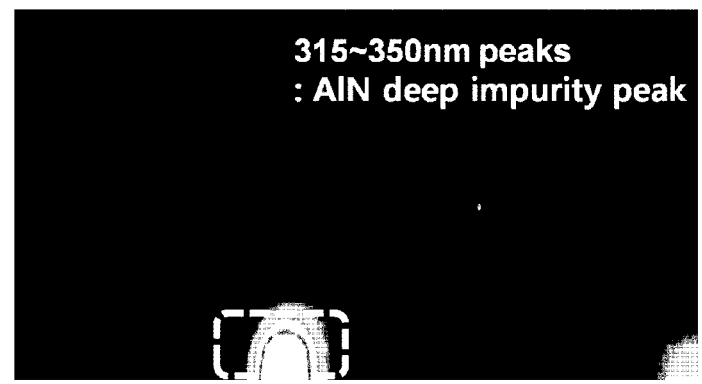

Air voids illustrated as black solid lines in FIG. 12A are illustrated as fuzzy portions in FIG. 12B. In the left SEM image of FIG. 12C, black solid lines indicate air voids. Referring to the CL image of FIG. 12C, distribution of dislocations between a sapphire substrate and an AlN intermediate layer may be estimated. Referring to FIG. 12D, an AlN deep impurity peak (315-350 nanometer peak) is observed at a region where air voids are formed. This shows that dislocations are concentrated around air voids.

Referring to FIG. 12A, the air voids have random sizes and have a predetermined width in a transverse direction as described above. However, the air voids having sizes at nanometer scale are illustrated as vertical lines in the SEM images. As resolution for measuring the air voids is increased, electrons may be charged on the surface of a sample, thereby deteriorating resolution of the images.

CL images may be obtained by irradiating a sample with x-rays and measuring absorption spectra. In FIGS. 12B and 12C, portions around the air voids are fuzzy due to limited resolution of an optical detector used to obtain CL images. Particularly, since peaks of optical spectrum are exhibited not portions corresponding to the air voids but portions corresponding to dislocations formed around the air voids, the positions of the air voids may not be clearly detected.

FIG. 12D is a spectrum obtained by line-scanning a predetermined position. FIG. 12D is obtained by use of an average of fuzzy images illustrated in FIGS. 12B and 12C over a predetermined period of time and by reducing noise generated during measurement. As a result, the position of the air void is clearly indicated.

Upon comparison with formation of air voids using a conventional method including photolithography and etching using a mask, air void density increases in the light emitting device manufactured according to the aforementioned process. Thus, according to the present embodiment, high quality air voids may grow since AlN grows horizontally, and light scattering may be improved due to denser air voids. In addition, a manufacturing process may be simplified since a mask is not used.

Figure 13:
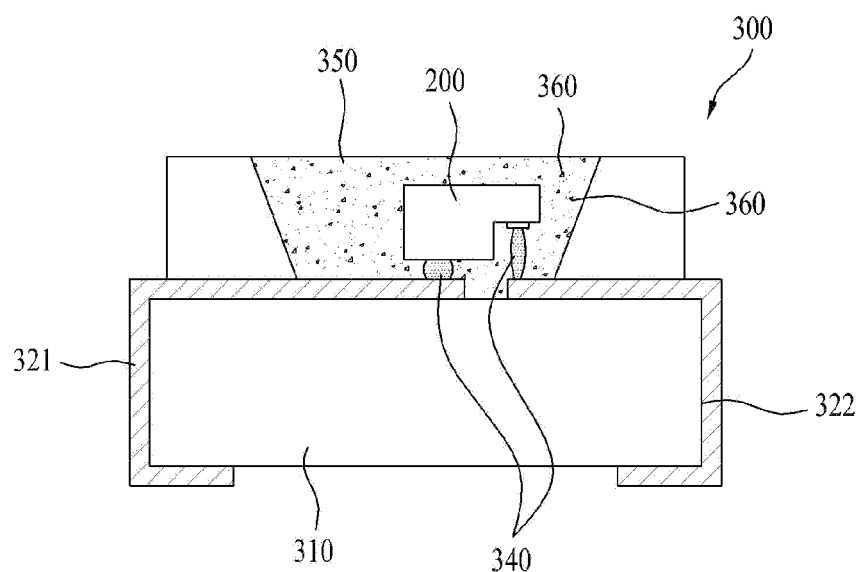
FIG. 13 is a diagram illustrating a light emitting device package in which a light emitting device is aligned according to an embodiment of the present disclosure.

FIG. 13 is a diagram illustrating a light emitting device package 300 including light emitting devices according to an embodiment of the present disclosure.

According to the illustrated embodiment, the light emitting device package 300, which is a flip-chip type light emitting device package, includes a body 310 having a cavity, first and second lead frames 321 and 322 mounted on the body 310, a light emitting device 200 according to one of the above-described embodiments, which is mounted on the body 310 to be electrically connected to the first and second lead frames 321 and 322, and a mold 350 formed in the cavity.

The body 310 may be formed of a silicon-based material, a synthetic resin material, or a metallic material. When the body 310 is formed of a conductive material such as a metallic material, an insulating layer is coated over the surface of the body 310, although not shown, in order to avoid electrical short circuit between the first and second lead frames 321 and 322.

The first and second lead frame 321 and 322 are electrically isolated from each other and supply current to the light emitting device 200. The first and second lead frames 321 and 322 may also reflect light generated by the light emitting device 200 so as to achieve an enhancement in luminous efficacy. In addition, the first and second lead frames 321 and 322 may dissipate heat generated by the light emitting device 200.

The light emitting device 200 may be electrically connected to the first and second lead frames 321 and 322 via solders 340 having ball shapes.

The mold 350 may encapsulate the light emitting device 200 to protect the same. In addition, the mold 350 includes phosphors 360 that are conformably coated in the mold 350 as a separate layer from the mold 350. In this structure, wavelengths of light emitted from the light emitting device 200 may be converted by the distributed phosphors 360 throughout the entire light emission area of the light emitting device package 300.

Light of a first wavelength range emitted from the light emitting device 200 is excited by the phosphors 350 and thus changed into light of a second wavelength range. As the light of the second wavelength range passes through a lens (not shown), the optical path thereof may be changed.

Since dislocations at the interface between the substrate and the intermediate layer are blocked by the air voids during a growth process in the light emitting device 200 disposed in the light emitting device package 300, the light emitting structure formed of AlGaN or GaN may have improved quality. Particularly, in a horizontal light emitting device, light extraction efficiency may be improved by the air voids.

In particular, when at least one of the first conductivity-type semiconductor layer and the second conductivity-type semiconductor layer includes AlGaN, and the active layer includes AlGaN/GaN in the light emitting device 200, a peak wavelength of UV light emitted from the light emitting structure may be in the range of 315 nm to 350 nm. In this regard, the light emitting structure may have considerably improved quality and light extraction efficiency since dislocations merge by the alignment of the air voids in the substrate of the light emitting device 200.

One or a plurality of the light emitting devices 200 may be mounted in the light emitting device package 300, but the present disclosure is not limited thereto.

According to the illustrated embodiment, a plurality of the light emitting device packages is arrayed on the substrate. Optical members, namely, light guide plates, prismatic sheets, diffusion sheets, and the like may be arranged on optical paths of the light emitting device packages. Such light emitting device packages, substrates, and optical members may function as a light unit. According to another embodiment, a display apparatus, an indication apparatus, or a lighting system may be implemented using the semiconductor light emitting devices or light emitting device packages described in conjunction with the above-described embodiments. The lighting system may include, for example, a lamp or a street lamp. Hereinafter, a lighting apparatus as examples of the lighting system including the light emitting device packages will be described.

Figure 14:
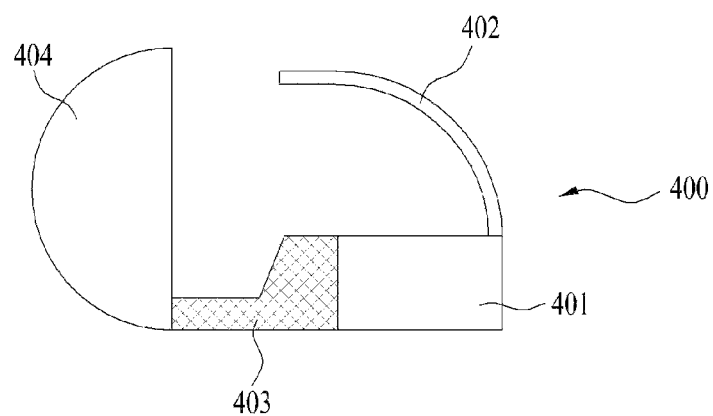
FIG. 14 is a diagram illustrating a lighting apparatus according to an embodiment of the present disclosure.

FIG. 14 is a diagram illustrating a lighting apparatus including a light emitting device package according to an embodiment of the present disclosure.

Referring to FIG. 14, light emitted from a light emitting device module 401, in which a light emitting device package according to the above-described embodiment is disposed, passes through a lens 404 after being reflected by a reflector 402 and a shade 403, so as to be directed forward of a vehicle.

In the light emitting device disposed in the light emitting device module 401 as described above, dislocations formed at an interface between the substrate and the intermediate layer are prevented by air voids during the growth process. Thus, the light emitting structure formed of AlGaN or GaN may have improved quality. Particularly, a horizontal light emitting device may have improved light extraction efficiency due to air voids.

Figure 15:
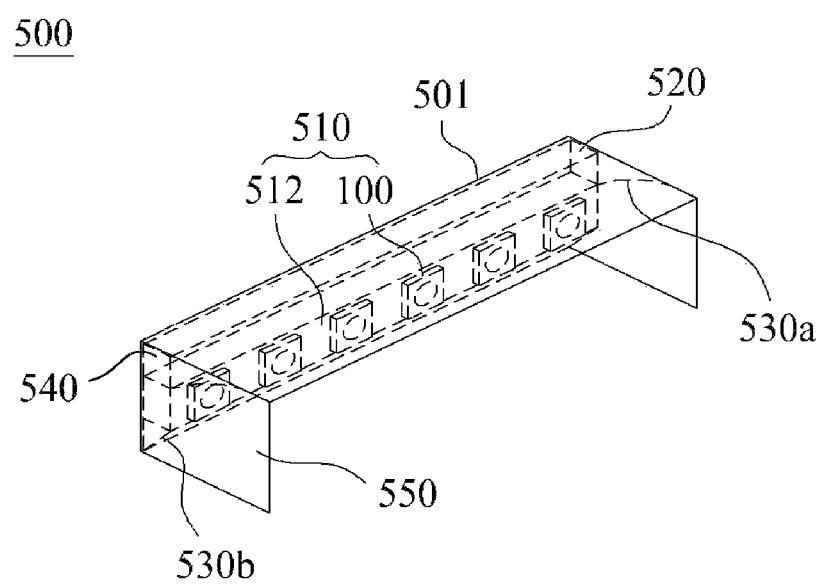
FIG. 15 is a diagram illustrating a sterilizer including a light emitting device according to an embodiment of the present disclosure.

FIG. 15 is a diagram illustrating a sterilizer including a light emitting device according to an embodiment of the present disclosure.

Referring to FIG. 15, the sterilizer 500 includes a light emitting module 510 mounted on one surface of a housing 501, diffuse reflection members 530a and 530b to diffusively reflect emitted deep UV light, and a power supply 520 that supplies power required by the light emitting module 510.

The housing 501 has a rectangular structure in which the light emitting module 510, the diffuse reflection members 530a and 530b, and the power supply 520 are integrally mounted, i.e., a compact structure. In addition, the housing 501 may be formed of a material and have a shape for efficiently discharging heat generated by the sterilizer 500. For example, the material used to form the housing 501 may include one selected from the group consisting of Al, Cu, and any alloy thereof. Thus, the housing 501 may have improved heat transfer efficiency, thereby exhibiting improved heat dissipation.

Alternatively, the housing 501 may have a particular external surface shape. For example, the housing 501 may have an external surface shape such as a corrugation shape, a mesh shape, or a irregular uneven pattern. Thus, heat may be more efficiently transferred from the housing 501 to the outside, thereby improving heat dissipation.

Meanwhile, an attachment plate 550 may further be disposed at both ends of the housing 501. The attachment plate 550 refers to a bracket element used to fix the housing 501 to the entire device as illustrated in FIG. 15. The attachment plate 550 may protrude from both ends of the housing 501 in a predetermined direction. In this regard, the predetermined direction is an inward direction of the housing 501 where deep UV light is emitted and diffuse reflection occurs.

Thus, the attachment plate 550 disposed at both ends of the housing 501 provides a fixing region to the entire device to allow the housing 501 to be more efficiently fixed thereto.

The attachment plate 550 may have one shape selected from the group consisting of a screw coupling unit, a rivet coupling unit, an adhesive unit, and a detaching unit. In this regard, these various coupling units will be apparent to those skilled in the art, and thus a detailed description thereof will not be given herein.

Meanwhile, the light emitting module 510 is mounted on one surface of the housing 501. The light emitting module 510 emits deep UV light to kill microorganisms in the air. To this end, the light emitting module 510 includes a substrate 512 and a plurality of light emitting device packages 100 mounted on the substrate 512. In this regard, each light emitting device package 100 corresponds to the light emitting device package 100 illustrated in FIGS. 2 to 4. Thus, each light emitting device package is designated by the same reference numeral.

The substrate 512 may be a PCB including a circuit pattern aligned in a single row along an inner surface of the housing 501. The substrate 512 may also be a metal core PCB (MCPCB) and a flexible PCB in addition to general PCBs, but the present disclosure is not limited thereto.

Then, the diffuse reflection members 530a and 530b refer to members having a reflection plate to cause diffuse reflection of deep UV light emitted from the aforementioned light emitting module 510. The diffuse reflection members 530a and 530b may have various front shapes and may be aligned in various forms. The diffuse reflected deep UV light may be radiated in an overlapping manner to improve radiation intensity or to enlarge a width of a region exposed to the deep UV light by slightly modifying a planar structure such as radius of curvature of the diffuse reflection members 530a and 530b.

The power supply 520 receives power and supplies power required by the light emitting module 510. The power supply 520 may be disposed in the housing 501. As illustrated in FIG. 15, the power supply 520 may be disposed at an inner wall of a space between the light emitting module 510 and each of the diffuse reflection members 530a and 530b. A power connector 540 to connect the light emitting module 510 and the diffuse reflection members 530a and 530b may further be disposed to introduce an external power supply into the power supply 520.

As illustrated in FIG. 15, the power connector 540 may have a planar shape or may have a shape of a socket or a cable slot to which an external power cable (not shown) may be electrically connected. In addition, the power cable has a flexible extension structure so as to be efficiently connected to an external power supply.

In the light emitting device disposed in the sterilizer according to the present embodiment as described above, dislocation occurring at an interface between the substrate and the intermediate layer is prevented by air voids during the growth process. Thus, quality of the light emitting structure formed of AlGaN or GaN may be improved. Particularly, a horizontal light emitting device may have improved light extraction efficiency due to air voids.

As is apparent from the above description, air voids block dislocation that occurs at the interface between the substrate and the intermediate layer during the growth process in the light emitting device according to the present embodiment. Thus, the light emitting structure formed of AlGaN or GaN may have improved quality. In particular, light extraction efficiency may be improved by air voids in a horizontal light emitting device.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a substrate;
   a light emitting semiconductor structure disposed on the substrate; and
   an intermediate layer interposed between the light emitting semiconductor structure and the substrate,
   wherein:
   the light emitting semiconductor structure comprises a first conductivity-type semiconductor layer, a second conductivity-type semiconductor layer, and an active layer interposed between the first conductivity-type semiconductor layer and the second conductivity-type semiconductor layer, wherein the active layer has a multi quantum well structure comprising at least one period of a pair structure of a quantum barrier layer and a quantum well layer;
   the intermediate layer comprises AN and has a plurality of air voids formed in the AN, wherein at least some of the air voids are irregularly aligned; and
   the number of the air voids is $10^7/cm^2$ to $10^{10}/cm^2$.

2. The light emitting device according to claim 1, wherein at least one of the first conductivity-type semiconductor layer and the second conductivity-type semiconductor layer includes AlGaN.

3. The light emitting device according to claim 2, wherein the first conductivity-type semiconductor layer comprises $Al_xIn_yGa_{(1-x-y)}N$ ($0 \leq x \leq 1$, $0 \leq y \leq 1$, and $0 \leq x+y \leq 1$), and the second conductivity-type semiconductor layer comprises $In_xAl_yGa_{1-x-y}N$ ($0 \leq x \leq 1$, $0 \leq x \leq 1$, and $0 \leq x+y \leq 1$).

4. The light emitting device according to claim 1, wherein the quantum well layer comprises a second conductivity-type dopant.

5. The light emitting device according to 1, wherein a peak wavelength of light radiated from the light emitting semiconductor structure is in the range of 315 nm to 350 nm.

6. The light emitting device according to claim 1, wherein the intermediate layer has a thickness of 1.5 μm to 20 μm.

7. The light emitting device according to claim 1, wherein each of the air voids has a height smaller than a thickness of the intermediate layer by at least 1 μm.

8. The light emitting device according to claim 1, wherein each of the air voids has a height of 0.5 μm to 19 μm.

9. The light emitting device according to claim 1, wherein each of the air voids has one end disposed in contact with the interface between the substrate and the intermediate layer or to be spaced apart from the interface and the other end disposed in the intermediate layer.

10. The light emitting device according to claim 9, wherein a material forming the intermediate layer laterally grows around each of the air voids to merge at an upper portion of the other end of the air void.

11. The light emitting device according to claim 9, wherein dislocations of the intermediate layer laterally growing around each of the air voids merge at an upper portion of the other end of the air void.

12. The light emitting device according to claim 8, wherein a distance between one end of each of the air voids and a region of the air void having a maximum width is greater than a distance between the region having the maximum width to the other end of the air void.

13. The light emitting device according to claim 12, wherein a region of each of the air voids having a maximum width is spaced apart from the interface between the substrate and the intermediate layer and the interface between the intermediate layer and the light emitting structure.

14. The light emitting device according to claim 1, wherein a difference in thermal expansion rate between the substrate and the intermediate layer is greater than a difference in thermal expansion rate between the intermediate layer and the light emitting structure.

15. The light emitting device according to claim 1, wherein the number of the air voids is in the range of $10^7/cm^2$ to $10^8/cm^2$ or $10^9/cm^2$ to $10^{10}/cm^2$.

16. A light emitting device comprising:
    a substrate;
    a light emitting semiconductor structure disposed on the substrate; and
    an intermediate layer interposed between the light emitting semiconductor structure and the substrate,
    wherein:
    the light emitting semiconductor structure comprises a first conductivity-type semiconductor layer, a second conductivity-type semiconductor layer, and an active layer interposed between the first conductivity-type semiconductor layer; and
    a plurality of air voids formed in the intermediate layer, wherein at least some of the air voids are irregularly aligned and the number of the air voids is $10^7/cm^2$ to $10^{10}/cm^2$.

* * * * *